United States Patent [19]

Lindmayer

[11] Patent Number: 4,705,952

[45] Date of Patent: Nov. 10, 1987

[54] COMMUNICATIONS APPARATUS USING INFRARED-TRIGGERED PHOSPHOR FOR RECEIVING INFRARED SIGNALS

[75] Inventor: Joseph Lindmayer, Potomac, Md.

[73] Assignee: Quantex Corporation, Rockville, Md.

[21] Appl. No.: 786,095

[22] Filed: Oct. 10, 1985

[51] Int. Cl.$^4$ ............................................... G01T 1/11
[52] U.S. Cl. ............................. 250/484.1; 250/483.1; 455/619
[58] Field of Search ............... 250/484.1, 483.1, 337; 455/619, 617

[56] References Cited

U.S. PATENT DOCUMENTS

| | | | |
|---|---|---|---|
| 3,066,222 | 11/1967 | Poorman et al. | 250/352 |
| 3,610,932 | 10/1971 | Morse et al. | 455/619 |
| 3,859,527 | 1/1975 | Luckey | 250/337 |
| 3,959,658 | 5/1976 | Ziemer et al. | 250/484.1 |
| 4,064,066 | 12/1977 | Toshinai et al. | 252/301.6 R |
| 4,236,078 | 11/1980 | Kotera et al. | 250/327.1 |

*Primary Examiner*—Carolyn E. Fields
*Assistant Examiner*—Richard Hanig
*Attorney, Agent, or Firm*—Peter C. Van Der Sluys

[57] ABSTRACT

An infrared communications device includes a novel infrared-triggered phosphor which stores energy in the form of visible light of a first wavelength and releases energy in the form of visible light of a second wavelength when triggered by infrared light. Modulated infrared input signals produce modulated visible light output signals which are supplied through a photomultiplier to amplification and demodulation circuitry. The phosphor is a composition comprising an alkaline earth metal sulfide, rare earth dopants, and a fusible salt.

16 Claims, 4 Drawing Figures

EMISSION SPECTRUM UNDER NEAR-INFRARED ILLUMINATION

COMMUNICATIONS APPARATUS USING INFRARED-TRIGGERED PHOSPHOR FOR RECEIVING INFRARED SIGNALS

BACKGROUND

With the development of a wide variety of infrared radiation sources, infrared radiation is being increasingly utilized for communications and signaling purposes. Infrared receiving devices have primarily consisted of semiconductors having relatively narrow bandgaps. These devices are relatively slow and cannot be used in high data rate transmissions appropriate to light communications. Conversely, contemporary high speed photomultipliers, such as those made of GaAs, lose their response in the infrared region. It would, therefore, be desirable to provide a high-speed optical upconverter that will change incoming infrared signals into shorter wavelengths so that the potential of high-speed solid state photomultipliers could utilized. It is generally desirable to provide a device that is capable of optical upconversion for all those situations where a change in light wavelength is beneficial.

SUMMARY OF THE INVENTION

The present invention overcomes the problems and disadvantages of the prior art by providing communications apparatus which does not require infrared-sensitive solid state electronic devices. Instead, the basic infrared detection function is provided by a novel infrared-triggered phosphor.

The invention employs the phenomenon of photoluminescence, which is the ability of certain solids, known as phosphors, to emit light when driven, or charged, by an external energy source. Many well-known phosphors are triggered by high-energy electrons or photons and emit photons of lower energy. However, there is another type of phosphor which can store energy for long periods of time by "trapping" electrons in certain energy states. The trapped electrons are then released at a later time to emit photons when stimulated by less energetic photons. The effect of this phenomenon is that energy is stored in the form of trapped electrons for later use. Materials which exhibit this phenomenon will be referred to as electron trapping, or ET phosphors, and materials in which emission of light is activated by infrared lumination are called infrared, or IRET phosphors.

It has been recognized recently that certain IRET phosphors can actually operate at high speeds and are capable of converting pulsed infrared light to the visible range (orange). This "upconversion" occurs at the expense of the original charging illuminating light and can actually exhibit optical gain. It has been observed that the stored electrons are depleted very slowly and that the upconversion continues for as long as several days before a new short recharge is required.

The invention thus provides communications apparatus comprising a phosphor adapted to store energy absorbed in the form of electromagnetic radiation of a first frequency and to release energy in the form of electromagnetic radiation of a second frequency when triggered by electromagnetic radiation of a third frequency; means for charging said phosphor with electromagnetic radiation of said first frequency; means for receiving input signals of said third frequency containing information modulated thereon and for directing said input signals onto said phosphor, whereby said phosphor generates output signals containing said information in the form of electromagnetic radiation signals of said second frequency; means for converting said output signals into electrical signals containing said information; and means for extracting said information from said electrical signals.

The accompanying drawings which are incorporated in and constitute a part of the specification illustrate one embodiment of the invention and, together with the description, serve to explain the principles of the invention.

DESCRIPTION OF THE PREFERRED EMBODIMENT

Figure 1:
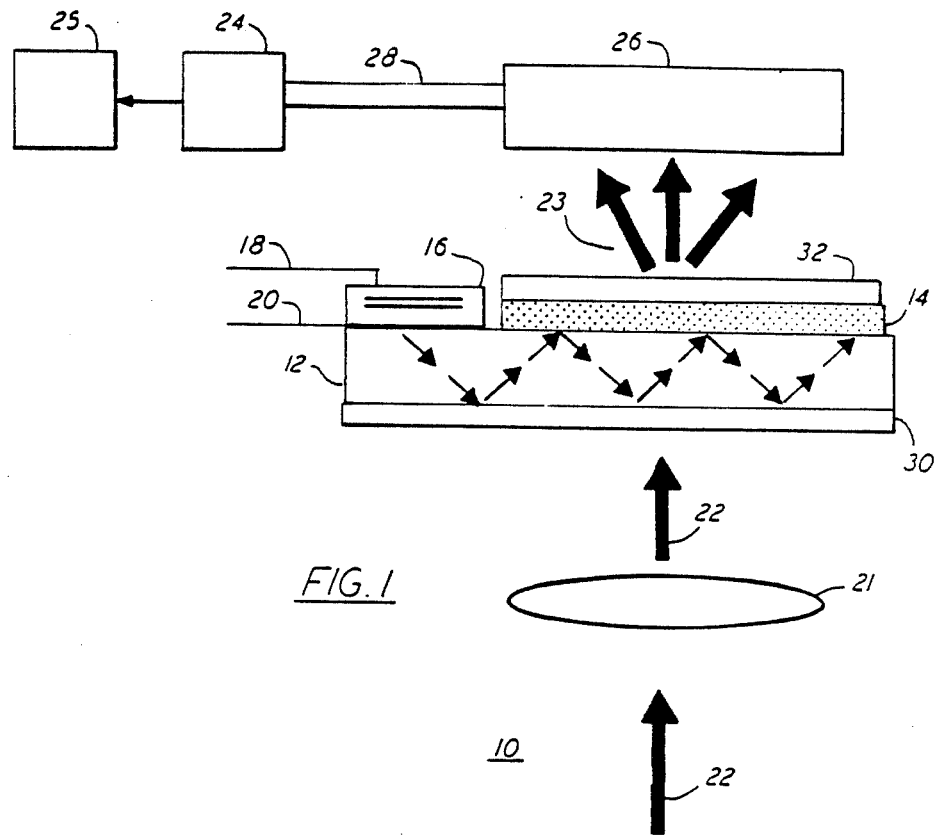
FIG. 1 is a schematic diagram of a communications receiver which constitutes a preferred embodiment of the invention.

Reference will now be made in detail to the present preferred embodiment of the invention, an example of which is illustrated in the accompanying drawings, in which like reference characters refer to corresponding elements. There is shown in FIG. 1 an infrared communications receiver 10. Receiver 10 includes a substrate 12 supporting an ET phosphor 14 deposited as a thin film. Substrate 12 is transparent to infrared radiation, and in the preferred embodiment is formed of synthetic sapphire. Phosphor 14 is adapted to store energy absorbed in the form of electromagnetic radiation of a first frequency and to release energy in the form of electromagnetic radiation of a second frequency when triggered by electromagnetic radiation of a third frequency. In a preferred embodiment, phosphor 14 comprises an IRET phosphor which absorbs light of a specific frequency such as green light and emits light of a lower frequency such as orange light when triggered by infrared radiation. Phosphor 14 will be more completely described hereinafter.

The invention also includes means for charging the phosphor with electromagnetic radiation of the first frequency. In the preferred embodiment, the charging means comprises a solid state electroluminescent lamp 16 including energizing conductors 18, 20. When energized, lamp 16 emits green light which travels through a process of internal reflection through substrate 12 to charge phosphor 14. Lamp 16 is well known, and may be a type 94 commercially available from the Grimes Manufacturing Co. Lamp 16 need only be energized at extended intervals, and may thus be energized periodically on a fixed schedule, on demand when communication is not taking place or continuously if isolation between charging radiation and signal radiation is maintained. In certain applications, sunlight or ambient artificial light can be used to charge phosphor 14.

The invention also includes means for receiving pulse modulated input signals 22 of electromagnetic radiation of the third frequency and for directing the input signals onto phosphor 14 whereby phosphor 14 generates output signals in the form of electromagnetic radiation signals of the second frequency modulated in the same manner as the input signals. In a preferred embodiment, the receiving means comprises an optical system indicated schematically at 21 for directing a pulse modulated infrared signal 22 of wavelength of about 900 nm. through substrate 12 to phosphor 14. Phosphor 14 then generates output signals 23 in the form of orange light of about 600 nm. modulated in the same manner as the infrared input signals.

The invention may also include means for converting the output signals into electrical signals containing the information. As embodied herein, the converting means comprises a photomultiplier 24 which generates an electrical signal proportional to the intensity of the modulated orange light impinging thereon. Photomultiplier 24 may be a high-speed gallium arsenide photomultiplier obtainable from the Hughes Corporation.

The invention may further comprise means for extracting information from electrical signals generated by photomultiplier 24. As embodied herein, the extracting means comprises conventional receiver circuitry 25 where the information originally supplied by the infrared input signals and present in orange output signals and photomultiplier electrical signals is extracted, amplified, and converted to a desired format. Circuitry 25 is of conventional construction and may be, for example, any receiver capable of converting baseband pulse modulated signals into text signals, such as well known in the communications industry.

Receiver 10 may also include an optical concentrator 26 and wave guide 28 to collect and concentrate orange light emitted by phosphor 14 and direct it to the input of photomultiplier 24. Concentrator 26 may be of the so-called "crab eye" or "Wilson" type. Wave guide 28 is an optical fiber cable, also well-known.

The preferred embodiment further includes a first optical coating 30 formed on substrate 12 on the side thereof opposite photomultiplier 24. First optical coating 30 may be a material such as magnesium fluoride and has a thickness which is an odd multiple of a quarter wave length of the infrared input signal. First optical coating 30 thus maximizes the transmission of input signals to substrate 12 and phosphor 14 and maximizes reflection of output signals such that the orange output signal generated by phosphor 12 is transmitted to the greatest extent possible to photomultiplier 24.

The preferred embodiment of the invention further includes a second optical coating 32 formed on substrate 12 on the side thereof opposite from first optical coating 30. Second optical coating 32 is also of magnesium fluoride material and has a thickness which is an odd multiple of a quarter wavelength of output signals generated by phosphor 14. Thus, optical coating 32 maximizes transmission of output signals from phosphor 14 and maximizes reflections of infrared input signals such that receiver 10 exhibits maximum sensitivity.

Phosphor 14 may be deposited on substrate 12 by silk screening a phosphor powder onto substrate 12. Alternatively, the components of phosphor 14 may be deposited on substrate 12 and fired at a temperature of 1000°-1100° C. to cause phosphor 14 to recrystallize on the surface of substrate 12. Phosphor 14 may also be deposited by electron beam evaporation or by sputtering. In this manner, a thin film device may be established to decrease response time.

Figure 2:
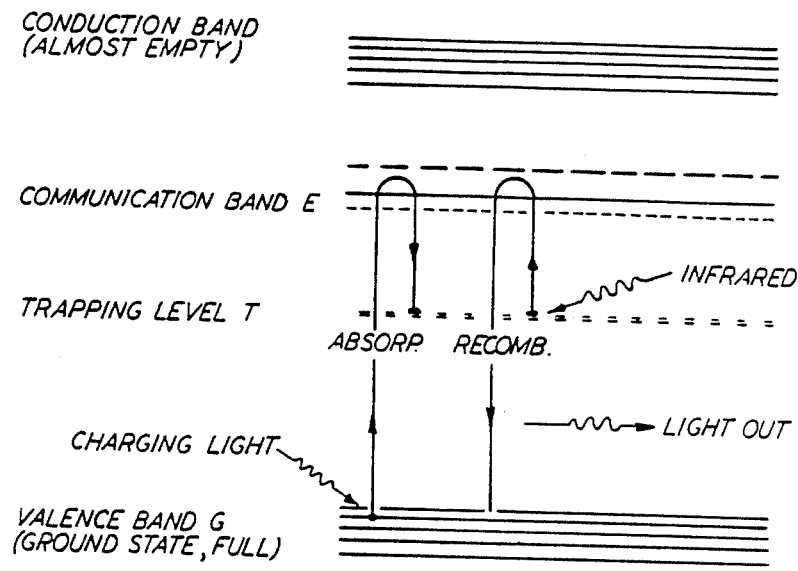
FIG. 2 is an energy diagram illustrating a phenomenon exhibited by the phosphor of FIG. 1.

The energy relations present in phosphor 14 will now be described. Referring to the energy diagram of FIG. 2, electrons at energy levels E and T are introduced by two selected impurities. Excitation of electrons by charging light having a minimum energy of E minus G will cause electrons to be raised to the band at energy level E. When charging illumination ceases, many of the excited electrons will fall to energy level T and remain trapped there. Trapping is illustrated by the action of the electron at the left of FIG. 2. Later exposure to triggering illumination of infrared can supply E minus T energies, kicking out the electrons from the traps at level T to level E, as shown at the right of FIG. 2. In level E (actually a band of levels), the electrons interact and start recombining with ground state electrons in level G. The resulting light emission is characterized by a wavelength associated with E minus G.

The density of electrons in the traps $n_t$ versus the electrons in the E band can be estimated as:

$$n/n_t = N_E/2N_t \exp(-E_t/kT)$$

where n is the concentration of electrons in the E band, $N_E$ is the concentration of states in the E band, $N_t$ is the concentration of traps, $E_t$ is the energy depth of traps measured from the edge of the E band, and kT is the thermal energy (26 meV at room temperature). (See for example, Lindmayer and Wrigley: "Fundamentals of Semiconductor Devices", Van Nostrand, New York, 1965, p. 445)

If the depth of the trap is several times higher than the thermal energy, the exponential is a very small number. Thus more than 99% of the electrons are in the trap. A lower trap density is preferred so that trapped electrons do not communicate with each other, thus cutting off recombination with ground state electrons. The depth of the traps in the preferred embodiment is about 1 eV. Then, in the dark, most of the traps are filled, band E is almost empty and recombination from T to G is negligible. The storage times become extremely long, on the order of years. The material is thus adapted to receive infrared photons, and to emit higher energy photons in a close to 1:1 relation. The emitted energy is higher, therefore the phosphor can be an optical amplifier in the upconversion mode.

The excitation of trapped electrons by IR raises them to band E, where they can interact with each other. It follows that with an E band cloud of electrons the statistical probability of recombination is proportional to $n_E \times n_G$. Since nG is practically constant, the light emitting E to G transitions (and therefore the light output) is controlled by $n_E$. This predicts an approximately linear relationship between orange intensity vs. infrared intensity in the phosphor of the preferred embodiment.

Preparation of phosphor 14 will now be described. It has been found that alkaline earth metal sulfides or selenides can form as inorganic crystals which are suitable as base materials for various purposes. The alkaline earth metals are those of column IIA of the table of elements. They are commonly available as their oxides, typically oxides of calcium, strontium, barium and sometimes magnesium. An "alkaline earth metal sulfide" thus is frequently a ternary crystal containing a column IIA metal, oxygen, and sulfur. It has further been found that the alkaline earth metal sulfides are highly preferred as base materials for phosphor 14.

To make phosphor 14, certain "activators" or dopants are added to the alkaline earth metal sulfide to produce energy levels for absorption and trapping. It is preferred that two dopants be used; typically from the lanthanide (rare earth) series. The concentration of these dopants is in the range of 100-1000 ppm.

In order to produce bulk materials, fusing of the components takes place by adding about 10% of fusible salts to the mixture. Fusible salts are typically compounds of elements of Column IA and 7A of the table of elements or elements of Column IIA and 7A elements. Examples include fluorides, chlorides, bromides, or iodides of Li, Na, K, Cs, Mg, Ca, Sr, or Ba. These compounds will melt in a temperature range below 1000° C. The resulting mixture is then compressed to form a pellet and placed in an alumina tray. An additional oxide such as tantalum oxide or zirconium oxide may be placed on the tray underneath the mixture to permit separation from the alumina. Alternatively, and preferably, the mixture in uncompressed powder form is placed directly into a graphite crucible.

The pellet on the tray or mixture in the graphite crucible is heated to high temperatures in the range of 1000°–1200° C. or more to fuse, diffuse, and recrystallize the components. This heating is performed in a dry, neutral gas, such as nitrogen or argon preferable at a temperature of about 1100°–1150° C.

EXAMPLE 1

100 parts of SrS powder, 10 parts of $BaSO_4$ powder and 10 parts of LiF (fusible salt) powder were mixed. Approximately 350 ppm of Sm and EuO were added as dopants. The powders were mixed carefully.

The powder mix was pressed into a pellet, placed on an isolating tablet of tantalum pentoxide, and placed on an alumina tray.

The assembly was heated to about 175° C. in flowing dry nitrogen for 25 minutes to dry.

The temperature was raised to about 1100° C. for about 30 minutes with dry nitrogen flowing.

The sample was slowly cooled for 10 minutes in nitrogen.

EXAMPLE 2

100 parts of SOS powder, 5.5 parts of $BaSO_4$ powder and 5.5 parts of LiF (fusible salt) powder were mixed. Approximately 400 ppm Sm and 500 ppm $EO_2O_3$ were added as dopants. The powders were mixed thoroughly.

The powder mix was poured in a graphite crucible.

The assembly was heated to about 175° C. in flowing dry nitrogen for 25 minutes to dry.

The temperature was raised to about 1100° C. for about 30 minutes with dry nitrogen flowing.

The sample was slowly cooled for 10 minutes in nitrogen.

Figure 3:
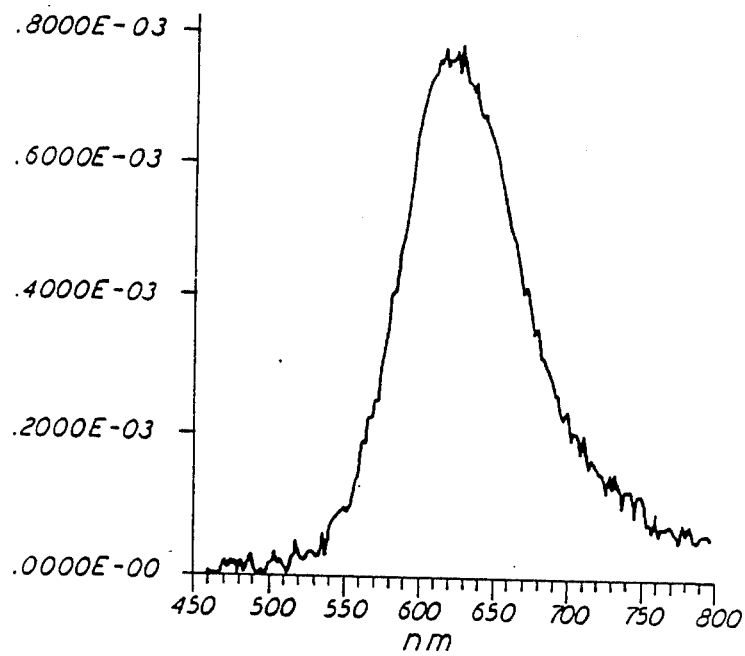
FIG. 3 is an emission spectrum of a phosphor incorporated in the embodiment of FIG. 1, under stimulation of near-infrared illumination.

The phosphor of the preferred embodiment can be charged up very quickly (less than 1 minute) in daylight, fluorescent light, or electroluminescent light. Basically, the charging wavelength should be 600 nm. or less. This phosphor will hold the charge for very long times. In order to trigger re-emission of visible light, an infrared source is required. The highest sensitivity occurs at around 900 nm. The emission occurs around 620 nm. (orange) with a bandwidth as shown in FIG. 3, measured by a Licor spectrophotometer (the "noise" arises from the instrument).

Preliminary investigations were made of the transient response of the phosphor of the preferred embodiment using "bulk" materials (as opposed to thinner films) when pulsed with IR sources. It was found that the "skin depth" of luminescent effects is about 0.5 mm. Such a depth causes some delayed effects in the transient response.

Figure 4:
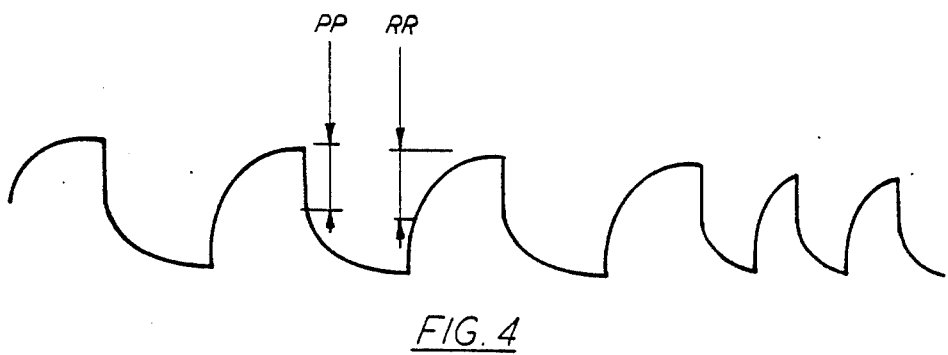
FIG. 4 is a graph of the response of a phosphor incorporated in the embodiment of FIG. 1.

FIG. 4 shows a recording of the orange response of a bulk form of the material of Example 1 to square pulses of infrared illumination. There are two distinct portions to the response curve. There is an almost instantaneous response, followed by a slow upward drift. It is believed that the slow upward drift arises from the fact that the sample is thick, and that the first step is associated with a quick photon-for-photon response (PP response). After some of the trapped electrons are removed near the surface layer, there are some empty traps. The light emission that is generated inside of the material can re-excite ground state electrons, which in turn start refilling the recently emptied traps. The updrift in the response is then a result of a slow interior release-retrap process (RR response). In other words, electrons are being transported toward the surface in the E band, but a portion of them are being continuously retrapped. This interior light "front" moves up to the surface and adds on to the PP response.

The RR process will thus diminish in a thinner sample, while the very fast PP response will approach the 1:1 ratio. (Clearly, the RR process uses more than one IR photon/orange photon.) It can be seen that a thin layer of phosphor produces improved results. In the preferred embodiment the phosphor is thus deposited on the substrate as a thin layer on the order of a small fraction of the skin depth.

It will be apparent to those skilled in the art that various modifications and variations can be made in the apparatus of the present invention and its construction without departing from the scope and spirit of the invention. Thus, it is intended that the present invention cover the modifications and variations of this invention provided that they come within the scope of the appended claims and their equivalents.

What is claimed is:

1. Optical conversion apparatus, comprising:
    a phosphor of the type that stores energy absorbed in the form of electromagnetic radiation of a first frequency and releases energy in the form of electromagnetic radiation of a second frequency when triggered by electromagnetic radiation of a third frequency;
    means for charging said phosphor with electromagnetic radiation of said first frequency;
    means for receiving input signals of electromagnetic radiation of said third frequency containing information modulated thereon and for directing said input signals onto said phosphor, such that said phosphor generates output signals containing said information in the form of electromagnetic radiation signals of said second frequency;
    means for converting said output signals into electrical signals containing said information; and
    means for extracting said information from said electrical signals.

2. Apparatus as recited in claim 1 comprising a substrate supporting said phosphor and transparent to electromagnetic radiation of said third frequency.

3. Apparatus as recited in claim 2 wherein:
    said receiving means comprises a first optical coating formed on said substrate on the side thereof opposite said converting means, said first optical coating comprising means for maximizing transmission of said input signals and maximizing reflection of said output signals; and
    wherein said apparatus comprises a second optical coating formed on said substrate on the side thereof opposite from said first optical coating, said second optical coating comprising means for maximizing transmission of said output signals and maximizing reflection of said input signals.

4. Apparatus as recited in claim 3 wherein said first frequency is greater than said second frequency and said third frequency is less than said second frequency.

5. Apparatus as recited in claim 4 wherein said first and second frequencies are in the visible light range and said third frequency is in the infrared range.

6. Apparatus as recited in claim 5 wherein said substrate is formed of synthetic sapphire.

7. Apparatus as recited in claim 6 wherein said charging means comprises an electroluminescent lamp.

8. Apparatus as recited in claim 7 wherein said charging means is operated non-continuously.

9. Apparatus as recited in claim 7 wherein said charging means is operated periodically.

10. Apparatus as recited in claim 1 wherein said converting means comprises an optical waveguide and a concentrator directing said output signals to said waveguide.

11. Apparatus as recited in claim 1 wherein said phosphor comprises a composition comprising:
   a compound selected from the group consisting of strontium sulfide, barium sulfide and a mixture thereof;
   a dopant selected from the group consisting of the rare earth series and europium oxide, and mixtures thereof; and
   a fusible salt.

12. Apparatus as recited in claim 11 wherein said fusible salt comprises a compound selected from the group consisting of fluorides, chlorides, bromides, and iodides of lithium, sodium, potassium, cesium, magnesium, calcium, strontium, and barium, and mixtures thereof.

13. Apparatus as recited in claim 11 wherein said phosphor comprises a composition comprising:
   100 parts strontium sulfide;
   a fusible salt consisting of a mixture of 10 parts barium sulfate and 10 parts lithium fluoride; and about 500 parts per million each of samarium and europium oxide.

14. Apparatus as recited in claim 11 wherein said phosphor is formed on said substrate in a thin film.

15. An optical upconverter, comprising:
   a phosphor of the type that stores energy absorbed in the form of electromagnetic radiation of a first frequency and releases energy in the form of electromagnetic radiation of a second frequency when triggered by electromagnetic radiation of a third frequency;
   means for charging said phosphor with electromagnetic radiation of said first frequency; and
   means for receiving input signals of electromagnetic radiation of said third frequency containing information modulated thereon and for directing said input signals onto said phosphor, such that said phosphor generates output signals containing said information in the form of electromagnetic radiation signals of said second frequency.

16. An optical upconverter as recited in claim 15 wherein said phosphor comprises an electron trapping phosphor.

* * * * *

UNITED STATES PATENT AND TRADEMARK OFFICE
CERTIFICATE OF CORRECTION

PATENT NO. : 4,705,952

DATED : November 10, 1987

INVENTOR(S) : Joseph LINDMAYER

It is certified that error appears in the above-identified patent and that said Letters Patent is hereby corrected as shown below:

Column 5, line 26, "EuO" should read --$Eu_2O_3$--;

line 39, "SOS" should read --SrS--;

line 41, "$EO_2O_3$" should read --$Eu_2O_3$--; and,

Column 7, line 26, "barium sulfide" should read --barium sulfate--.

Signed and Sealed this

Twenty-seventh Day of June, 1989

Attest:

DONALD J. QUIGG

*Attesting Officer*     *Commissioner of Patents and Trademarks*